United States Patent [19]

Saia

[11] 3,875,432

[45] Apr. 1, 1975

[54] TIMED SWITCH CIRCUITS UTILIZING MINORITY CARRIER INJECTION IN A SEMICONDUCTOR DEVICE

[75] Inventor: Jerry Saia, Kingston, N.Y.

[73] Assignee: International Business Machines Corporation, Armonk, N.Y.

[22] Filed: Oct. 21, 1971

[21] Appl. No.: 188,430

Related U.S. Application Data

[62] Division of Ser. No. 32,503, April 14, 1970, Pat. No. 3,696,285, which is a division of Ser. No. 586,775, Oct. 14, 1966, Pat. No. 3,609,410.

[52] U.S. Cl. .................. 307/299, 307/280, 307/300

[51] Int. Cl. ......................... H03k 3/26, H03k 19/08

[58] Field of Search ............ 307/246, 280, 300, 299

[56] References Cited

UNITED STATES PATENTS 3,299,290 1/1967 Moll .................................. 307/300

3,348,066 10/1967 Briley ................................ 307/280

*Primary Examiner*—Andrew J. James

*Attorney, Agent, or Firm*—Frederick D. Poag

[57] ABSTRACT

A family of circuits characterized by storage mode operation in a switching circuit employs minority carrier injection from the base into the collector region of a semi-conductor device. The minority carrier charge stored in the collector thereafter causes amplified forward collector emitter current when forward collector potential is applied. Particular examples of the circuit family includes inverters, single shot circuits transistor oscillators and electronic switching in general.

5 Claims, 15 Drawing Figures

TIMED SWITCH CIRCUITS UTILIZING MINORITY CARRIER INJECTION IN A SEMICONDUCTOR DEVICE

This is a division of application Ser. No. 32,503, filed Apr. 14, 1970, and now U.S. Pat. No. 3,696,285 which itself was a division of application Ser. No. 586,775, filed Oct. 14, 1966 and now U.S. Pat. No. 3,609,410.

This invention relates to semiconductor switching circuits and particularly to switching circuits utilizing minority carrier injection in a semiconductor device to provide storage mode operation. The basic mode switching circuit is particularly useful for inverter circuits, time delay or single shot circuits, transistor oscillators, and electronic switching circuitry in general.

Application of forward bias potential between the semiconductor diode formed by the base and collector regions of a transistor will cause the transfer of minority carriers from the base into the collector region whenever a collector potential is present opposite that which usually effects forward collector-emitter current flow. This phenomena is referred to herein as minority carrier injection. When the normal forward conduction potential is applied across the collector and emitter of this device thereafter, uncontrolled conduction will result which produces a forward current until the minority carriers have been depleted from the collector region at which time forward collector-emitter current will cease in the absence of forward biasing current at the base region.

Even when a transistor is in normal forward conduction in the saturated condition as a result of a forward driving base current, a percentage of minority carriers are injected in the collector; in the past, this has presented a problem to be overcome because the time for removal of the storage charge from minority carrier injection causes the device to continue conducting or to begin conducting at undesired times. Higher output ripple, lower frequency of operation or undesirable overlap from cycle to cycle are a result for inverter circuits. In conventional diodes, the time required for the minority carriers to clear and the diode to become effectively blocking is called reverse recovery time.

According to the present invention, the minority carrier storage phenomena is advantageously utilized in providing short duration switching circuits which make possible higher frequency inverter circuits and short pulse single shot or oscillator circuits. Thus, the basic switching circuit of the present invention includes a semiconductor device which has at least collector, base and emitter regions and a means for applying a current into the base region which will intentionally cause minority carriers to be injected from the base region into the collector region. The switching action of the present invention is then realized by placing a normal forward conduction potential across the collector and emitter regions which will result in a forward current flowing for a short period of time until the minority carriers have been depleted, at which time current conduction will cease thereby producing a short time duration output pulse. During storage charge depletion or recovery time, the switching transistor acts as if driving current were being introduced to the base. Switching circuits according to the basic configuration are capable of relatively high speed operation and thus permit high frequency performance with minimum component cost.

In one embodiment of the present invention, a pair of the aforementioned basic switching units are employed with a transformer in a free-running inverter configuration. A load is connected to the secondary of this transformer with the inductance of the transformers and/or the load providing commutation such that minority carriers are injected into one of the switching units when the minority carrier storage in the other switching unit begins to deplete. When the collector potential reverses in the first mentioned switching unit, it begins to conduct until the stored minority carriers are depleted. After the aforementioned depletion, the other switching unit will be driven into the minority carrier injection mode followed by forward conduction to complete one cycle of operation. The same principles can be generally applied to a series inverter arrangement. Further, the storage mode inverter circuit can be designed so that a trigger must be introduced thereto for each half cycle or full cycle of output pulses by designing the circuit so that the inductance effect will not initiate minority carrier injection but that this injection will only result when the triggers are introduced. The circuit can be controlled in both the free-running and the triggered configurations either in the primary circuitry, the secondary circuitry or a combination thereof.

In yet another embodiment employing the basic minority carrier injection switching unit described above, a short time delay or single short circuit is constructed such that introduction of an input trigger will initiate the minority carrier injection into a semiconductor device which is immediately followed by application of forward potential to cause a switching from minority carrier injection to minority carrier depletion thereby producing a single output pulse. In one form of this embodiment, an output pulse of a given duration is produced beginning at the time of removal of the trigger. In another embodiment of this single shot circuit, the output pulse will be of a width equal to the trigger time plus a relatively fixed time required for minority carrier depletion. Single shot circuits in accordance with this invention do not require the separate timing capacitor normally associated with the past such circuits.

A still further embodiment of this invention employs three of the basic minority carrier storage mode units in the so-called power-OR arrangement. In such circuits, at least two switching units provide power switching somewhat like an inverter and a third element in conjunction with the other switching units provides supplementary power.

It is a primary objective of the present invention to provide short time duration output pulses from a switching circuit by advantageously utilizing the minority carrier injection principle.

It is yet another object of this invention to employ the minority carrier storage phenomena in a semiconductor device for producing short pulse outputs when forward conducting potential is applied thereto.

A further object of this invention is to provide an inverter circuit employing the minority carrier storage mode unit as a basic element thereof.

A still further object of this invention is to provide an inverter circuit which utilizes minority carrier storage mode units in a free-running oscillatory manner.

Still another object of the present invention is to provide an inverter circuit employing minority carrier injection units as a basic element thereof with means for externally triggering the circuit.

Another object is to employ the minority carrier storage units in a series inverter arrangement.

Yet another object of this invention is to provide single shot circuits which employ the basic minority carrier injection circuitry as elements thereof.

A still further object is to provide power-OR operation using the storage mode elements as switching units.

The foregoing and other objects, features and advantages of the present invention will be apparent from the following more particular description of the preferred embodiments of this invention as are illustrated in the accompanying drawings in which:

FIG. 1 is a simplified equivalent diagram of the basic storage mode switching circuitry employing minority carrier injection;

FIG. 1*a* is an illustration of the actual components employed to effect FIG. 1 operation;

Figure 1:
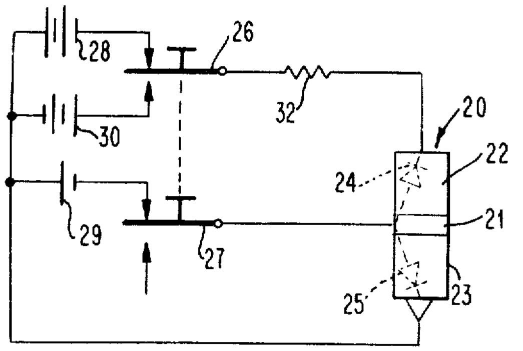
Figure 1A:
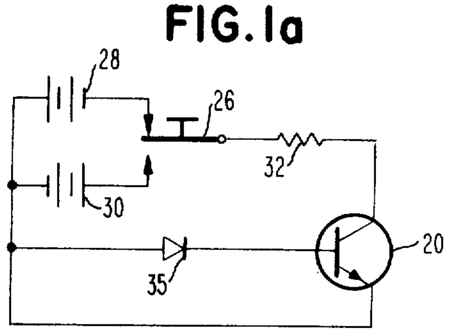

The basic switching circuit of the present invention is illustrated in FIG. 1*a* and is also shown in a simplified version for purposes of explanation in FIG. 1. Transistor 20 comprises a base region 21, a collector region 22 and an emitter region 23 and is here illustrated for this example as an NPN transistor. For circuit analysis purposes, transistor 20 can be considered to include a diode 24 shown dotted in FIG. 1 which is effectively connected between the base electrode and the collector electrode of transistor 20 and diode 25 which is effectively connected between the base and emitter electrodes. With switch 26 closed as shown, voltage source 28 will place a potential at the collector of 20 which is opposite the forward conduction potential therefor. However, diodes 24 in FIG. 1 and 35 in FIG. 1*a* are forward biased and permit current flow therethrough. The small potential drop developed across diode 35 in FIG. 1*a* as a result of this current has the effect of a biasing source 29 in FIG. 1 which reverse biases diode 25. The current flow from source 28 through diode 35 enters the base region 21 and ultimately enters the collector region 22 through the effective action of diode 24. This will cause a concentration of holes to begin to build up in collector region 22 thus forming a stored charge of minority carriers in collector region 22.

Figure 3:
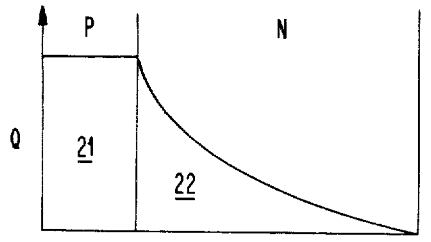
FIG. 3 is a graph of the minority carrier charge density within a semiconductor device.

The amount of minority carriers actually stored in collector region 22 will eventually reach equilibrium with the number being injected into base region 21 as a result of recombination and thereafter remain relatively constant. The distribution of the minority charge density across the geometry of the transistor at this equilibrium can be seen in FIG. 3. In an NPN transistor such as is here shown, collector current is generally thought of as electron flow while base current is considered both electron and hole flow. However, electron flow in the base is immaterial and for purposes of understanding the minority carrier injection, only hole flow and storage as is shown in FIG. 3 need be considered.

Subsequently when switches 26 and 27 are concurrently thrown, battery 30 will place a potential across transistor 20 in the direction to cause normal current flow therethrough. The opening of switch 27 leaves the base 21 with no input whatsoever which normally would result in transistor 20 being off. However, since a charge of holes has been accumulated in region 22, current will flow from source 30 through load 32, collector region 22 and base region 21 into emitter region 23 until all of the holes are depleted from region 22. At that time, collector-emitter current will cease to flow. The cycle of operation thus completed is the minority carrier injection and storage mode operation which results in the basic switching according to the present invention.

The forward conduction resulting in a transistor after minority carrier storage can be understood when it is recognized that the thickness of the base material is intentionally made small relative to the diffusion length which is an average length that a minority carrier can exist in a material before it recombines. Thus if the base thickness is small compared to this diffusion length, minority carriers that exist in the collector base region can drift and otherwise move to the emitter base junction without excessive loss. Forward biasing the collector-base junction results in injection of minority carriers into the collector-base area. When normal bias is applied to the collector-emitter, these carriers are able to move with relative ease to the emitter base junction where they are indistinguishable from conventional base current. During forward collector-emitter conduction after minority carrier injection, the stored charge is depleted in somewhat the same manner that a normal diode depletes such a charge. However, the transistor causes charge amplification during the carrier depletion time resulting in greater output charge flow than the amount required to effect minority carrier storage. Substantially constant current flows from the collector to emitter during stored charge depletion and is substantially determined by the circuit parameters. It is believed that the slope of the minority carrier density at the junction area during forward conduction that depletes the stored charge is a function of the current flow since $Ic = dQ/dt$. Thus it is thought that the hole concentration diminishes at a relatively constant slope.

Figure 2:
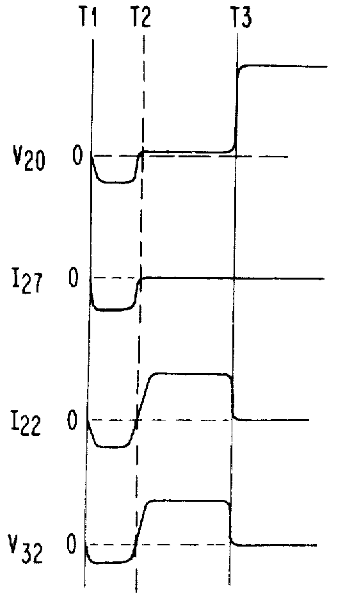
FIG. 2 is a typical time base diagram of the operation of the FIGS. 1 and 1*a* circuitry.

FIG. 2 illustrates the time base operation of the FIG. 1 and FIG. 1*a* circuitry. With switch contacts 26 and 27 initially set at time T1 as shown in FIG. 1, the voltage across transistor 20, V20, will appear at a slight reversed polarity which will develop a voltage drop across diode 35 to cause the power source 29 to appear to be present. The reverse current flow into base 21 through contact 27 can be seen on the plot of 127 in FIG. 2 which will cause minority carrier injection into collector 22 through effective diode 24. The small potential source 29 developed by diode 35 will have the effect of reverse biasing diode 25 and thus the minority carrier current will only occur between base region 21 and the collector region 22.

At time T2, contact 27 is opened and contact 26 is switched to place the forward conduction potential to source 30 across transistor 20 and thus cause forward current conduction from collector region 22 into emitter region 23. While the current flow through the collector 22 shown as 122 in FIG. 2 begins to conduct in the forward direction at T2, the minority carrier storage in collector 22 region will deplete between T2 and T3 with the amount of actual current flow being a factor of the amplification of transistor 20. More particularly, the amplification of transistor 20 for storage mode operation can be determined from the plot of 122 as the ratio of the area on the positive side of zero between T2 and T3 to the area on the negative side of zero between T1 and T2. The current flowing through the collector 22 of transistor 20 will cause a potential drop across load resistor 32 which is reflected in the drawing for V32 of FIG. 2. Since the forward conduction between collector 22 and emitter 23 between T2 and T3 is the result of a low impedance across the collector-emitter of 20, V20 will remain low until the collector current drops and then rise to develop the full potential of source 30 across 20. Thus an output pulse that is a function of the minority carrier storage is produced.

Figure 4:
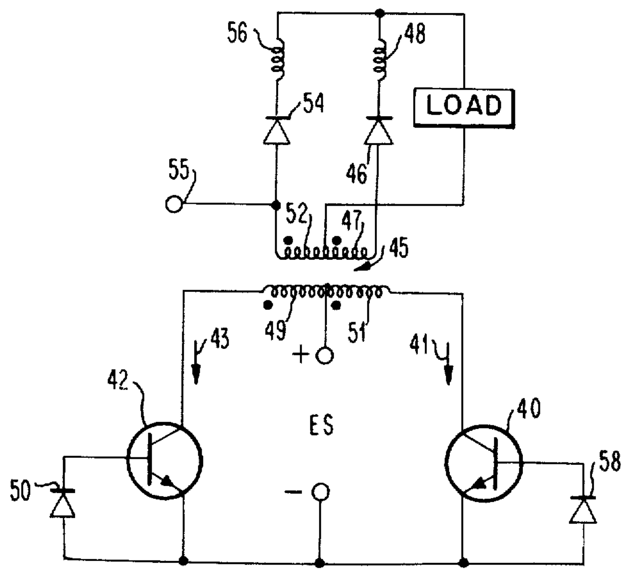
FIG. 4 illustrates a free-running storage mode inverter.

FIG. 4 illustrates an inverter circuit which advantageously employs the storage mode of operation described hereinabove for FIGS. 1 and 1*a* as a basic element thereof. For descriptive purposes, it is assumed that transistor 40 in FIG. 4 has been placed in the minority carrier storage condition. Current will then flow from the voltage source ES into the dotted end of primary winding 51 on transformer 45 and into the collector of transistor 40 as is shown by arrow 41. This creates a current in the secondary winding 52 that flows out of the dotted end thereof and through the forward biased diode 54 and the inductor 56 into the load. When the minority carriers are depleted in transistor 40, the collector current 41 therethrough will drop to zero.

The energy stored in inductor 56 will then cause the secondary circuit to assume the role of a generator. The reactance of the inductor 56 is such as to cause current to continue flowing in the same direction which is out of the dotted end of winding 52. As a result, primary winding 49 will assume a voltage thereacross such that the dotted end goes negative with respect to the battery end. As soon as the amplitude of this voltage overcomes the battery voltage ES, the diode 50 and the collector base junction of transistor 42 will become forward biased causing current to flow therethrough into the dotted end of winding 49. This action injects minority carriers into the collector base region of transistor 42 creating a stored change.

The dotted end of winding 51 also goes negative with respect to the end connected to the collector of transistor 40. This creates a voltage across the collector to emitter of transistor 40 of approximately two times the potential source ES. It is limited to this approximate voltage due to the clamping action of diode 50 and the collector base junction of transistor 42.

The current flow out of the dotted end of secondary winding 52 also creates a current flow into the dotted end of winding 47 which tends to forward bias diode 46. As the energy stored by the inductor 56 is dissipated, the voltage across winding 49 collapses discontinuing the conduction through diode 50 and the base-collector junction of transistor 42 thereby terminating the injection of minority carriers. Transistor 42 will then go into normal forward conduction (arrow 43) as a result of the minority carrier storage in conjunction with the forward conduction causing potential developed across 42 and will continue to conduct in a forward direction until this storage has been depleted. Such conduction of transistor 42 causes the current to flow out of the dotted end of winding 49 which results in further increasing the current into the dotted end of winding 47 thereby causing current to flow through the thus forward biased diode 46 and inductor 48 into the load. At this time diode 54 is reverse biased. When the stored charge in transistor 42 has been depleted, conduction will terminate resulting in a charge being stored in transistor 40 as a result of the collapsing field of inductor 48. As discussed hereinafter, a transistor used for 40 or 42 may be characterized by its charge gain which is the ratio of the forward charge recovered during depletion from collector to emitter to the amount of charge injected to effect this forward current flow. In order to deliver power to the load, the charge gain preferably would exceed unity.

This oscillatory process will continue as long as the battery power ES is maintained. The process could have been started by the injection of a negative pulse at the anode of either 46 or 54 but for this example is shown as being introduced at trigger terminal 55. The inverter could also be started in other ways such as the injection of a pulse into the base of either transistor 40 or 42. In addition to the free-running mode, the storage mode inverter can operate in a triggered mode where the inverter is purposely prevented from regeneration and requires a trigger pulse for every half cycle. In the trigger mode the secondary inductance is removed and a low impedance capacitor or free-running diode is placed on the output. This stops the inverter at the completion of any half cycle because there is no effective source in the secondary available to store a charge by turning the collector base junction of 40 or 42 on. Under such circumstances, a negative pulse alternatively applied to the anode of 46 or 54 could be used to initiate each half cycle or pulses could be introduced to the base or collector circuits of 40 or 42. The frequency of operation of the FIG. 4 circuit can be increased by causing switching to occur before the minority carrier injection and storage reach equilibrium.

Although separate inductors 48 and 56 are shown in the FIG. 4 embodiment and elsewhere in this application, it is to be appreciated that the necessary inductance to accomplish this function may be provided by the transformers themselves and separate inductors may not be necessary. Various other ways of providing the function of these inductors will be readily apparent to those having normal skill in the art.

By controlling the amount of current used to charge the switching transistor in the inverter circuits, the duration of the ON time of each switch can be controlled. The greater the magnitude of the current used to charge the transistor up to the storage equilibrium, the longer the transistor will stay on to deplete the stored charge. If the inverter is used in a triggered mode and the injection current is controlled, operation at a fixed frequency with a controllable cycle may be accomplished. An inverter employing such an arrangement can be used as a time ratio controlled voltage regulator. It is also possible to effect control in the secondary circuits by use of a saturable reactor. Arrangements employing the foregoing discussions are illustrated hereinafter with respect to FIGS. 5 and 6.

Figure 5:
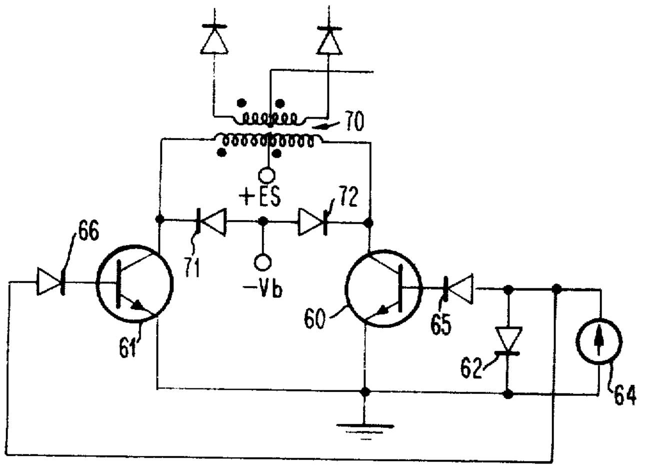
FIG. 5 is an illustration of a storage mode inverter employing current control in the primary.

A storage mode inverter which employs a control arrangement in the base circuit of the switching transistors is shown in FIG. 5. Transistors 60 and 61 are the primary switching elements and diode 62 shunts the control current from constant current source 64 to ground when the inverter is delivering power to the land. Diodes 65 and 66 are included to block reverse base current flow to achieve maximum recovery of the stored charge in addition to permitting minority carrier storage current injection substantially the same as has been discussed hereinbefore. At the time when the secondary circuit of transformer 70 is providing generator action, the collector-base current in either transistor 60 or 61 is limited by the constant current source 64 during storage charge injection. At these periods, diode 62 is blocking and diodes 71 and 72 provide collector voltage clamping as they conduct the balance of the current demand into transformer 70 primary circuits. Collector voltage clamping may be included to protect the emitter-base junction from reverse voltage in excess of their ratings.

By limiting collector-base saturating current to that produced by constant current source 64, the charge that is injected and recovered is thus controlled. Accordingly, the "on" time of each switch is thereby controlled and, if the period when base current is flowing is considered to be approximately constant, then the duty cycle of the switch itself is controlled. This results in direct control of the frequency of output pulses from the inverter circuit. It should be appreciated that the switching and minority carrier injection is commutated in the FIG. 5 circuitry substantially the same as was done in the FIG. 4 inverter circuit. Another method of control for the FIG. 5 circuitry is to utilize the triggered mode as mentioned previously in conjunction with the control of the saturating current in transistors 60 and 61. In this way, a controllable duty cycle at a fixed frequency is effected assuming the trigger rate is fixed.

Figure 6:
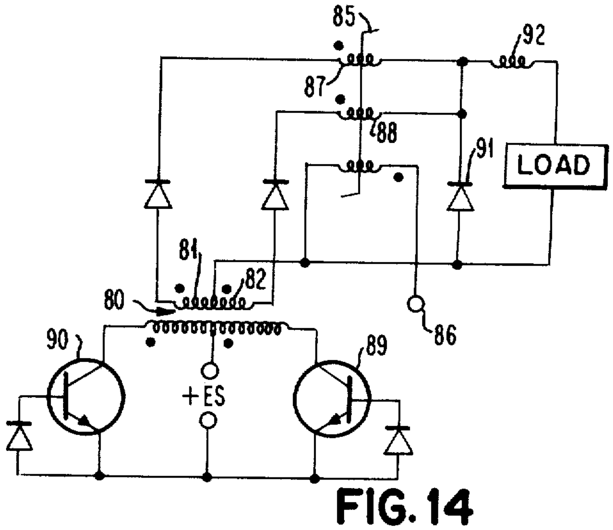
FIG. 6 is a diagram of a storage mode inverter utilizing variable inductance control in the secondary.

Another method of control may be effected as shown in FIG. 6. In this circuit, control is obtained in the secondary circuit by means of a variable inductance 85 in circuit with each of the secondary windings 81 and 82 of transformer 80. The inductance in the secondary circuits is controlled by variable inductance 85 control current which is introduced into terminal 86 to control the magnetic saturation of the core for 85. The inductance of winding 87 and winding 88 of variable inductor 85 effect the degree of saturation in switching transistors 89 and 90 respectively. Diode 91 provides a path for current flow into the load through inductor 92 during commutating of the primary circuit transistors. Both free-running and triggered operation are possible with this control method but some application would be necessary for the trigger mode as will be understood by those having normal skill in the art.

As mentioned previously, both primary and secondary controls may be employed in one inverter/converter arrangement. The control method consists of varying the stored charge in the switching transistors or varying the trigger rate or modifying the depletion action or any combination of the foregoing. It should be appreciated that the storage mode inverters shown herein are illustrated with NPN transistors but PNP transistors may be used in the primary circuit by reversing the polarity of all power supplies and diodes. Furthermore, it will be appreciated by those having normal skill in the art that storage mode operations of combinations of both NPN and PNP transistors can be incorporated in circuitry within the spirit of this invention.

Figure 7:
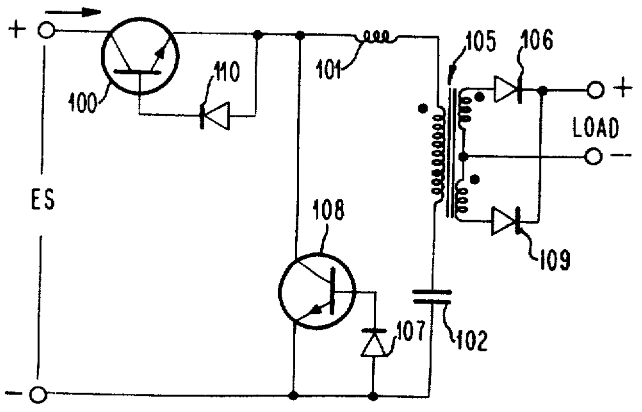
FIG. 7 is a storage mode inverter utilizing series switch operation in accordance with the present invention.

FIG. 7 illustrates an arrangement of a series switch type of inverter circuit utilizing the storage mode operation for switching elements thereof. The series inverter configuration has the advantage of avoiding operation of 2ES mode and a single primary inductance winding may be utilized to control both switches. In addition, a positive clamp action is provided by the minority carrier injecting diodes to limit the collector-emitter voltage.

Assuming that transistor 100 has been caused to have a minority carrier storage injected therein, current will flow in the direction of the arrow through the collector-emitter thereof in a positive direction through inductor 101 and charge storage capacitor 102 through the primary of transformer 105. Therefore, diode 106 will conduct and deliver power to the load. When the minority carriers are depleted in transistor 100, the collector-emitter current therethrough will drop to zero. The energy stored in inductor 101 will cause the path of current to switch into diode 107 and the collector-base path for switching transistor 108. This will cause minority carriers to be injected into the collector of transistor 108.

Storage capacitor 102 then becomes a primary driving voltage source and reverses the current through the primary of transformer 105, inductor 101 and transistor 108 which begins to deplete its storage charge. At that time, diode 109 begins to conduct power to the load. Thus the current in inductor 101 is flowing in a negative direction relative to the forward current for transistor 100 and after storage depletion for transistor 108 when the collector-emitter current through transistor 108 drops to zero, the current flowing in inductor 101 will switch into diode 110 and the collector-base path of switching transistor 100. This will cause minority carrier storage to be injected into the collector of transistor 100. This completes one cycle of operation of the inverter.

As in the other inverter circuits described hereinabove, the control may be moved into the secondary of transformer 105 by removing inductor 101, connecting the primary 105 directly to the emitter of transistor 100 and the collector of transistor 108 and placing the inductance in a secondary circuit in series with diodes 106 and 109. In addition, control may be established in the primary circuit by control current generators in the base of transistor 100 or the base of transistor 108 such as was shown in FIG. 5 hereinbefore. An important feature of the FIG. 7 circuitry is that the collector to emitter voltage to either transistors is clamped by the base diode and collector-base junction of the other transistors, thus reducing the maximum potential which these transistors must be able to withstand. The triggered mode of operation and combinations of primary and secondary control are applicable to the FIG. 7 circuitry as well as the prior inverter circuits.

Figure 8:
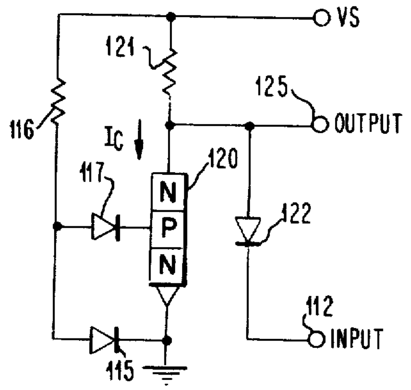
FIG. 8 is a time delay or single shot circuit with a storage mode circuit for the basic element thereof.
Figure 9:
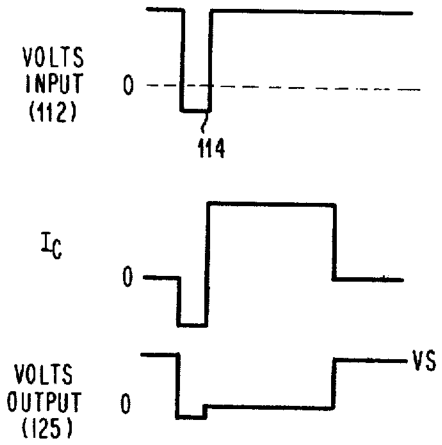
FIG. 9 is an idealized time base diagram for the FIG. 8 circuitry.

A time delay or "single-shot" circuit utilizing the present invention is illustrated in FIG. 8 with a somewhat idealized time base diagram therefor shown in FIG. 9. For this particular circuit, the normal level at the input terminal 112 is equal to or greater than the supply voltage VS. This results in a normally up level for the output voltage at terminal 125 as can be seen in FIG. 9. When the trigger pulse 114 is introduced, diode 115 is reverse biased and the current through resistor 116 flows through diode 117 and charges the collector base junction of transistor 120 to provide the minority carrier injection. The load for the trigger consists of this current and the current through resistor 121.

After the trigger pulse is removed and returns to the normal positive level, transistor 120 will be in storage and remain saturated until the storage charge is depleted. During this time, diode 117 is blocking base current flow and enhancing the stored charge depletion time. Diode 115 is conducting the current through resistor 116. After the stored charge is depleted, the collector voltage of 120 will return to the supply voltage level VS as a result of the blocking action provided by diode 122. The operating cycle of the FIG. 8 circuit produces a negative output pulse at output terminal 125 as can be seen from FIG. 9 which will commence with the introduction of the trigger pulse and will remain down for a time duration depending upon the storage of transistor 120.

Figure 11:
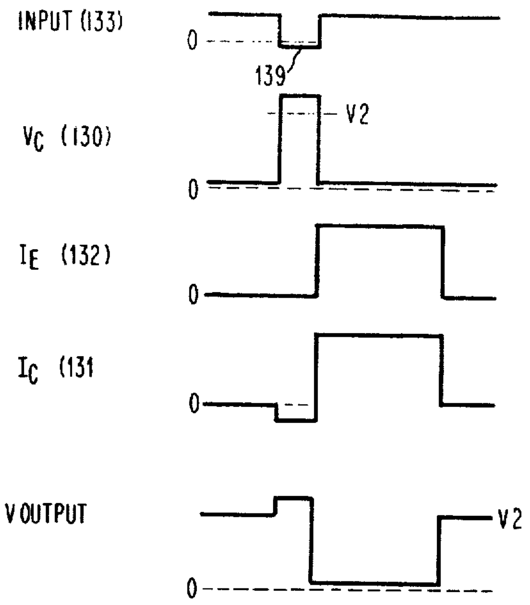
FIG. 11 is a time base diagram for the FIG. 10 circuitry.
Figure 10:
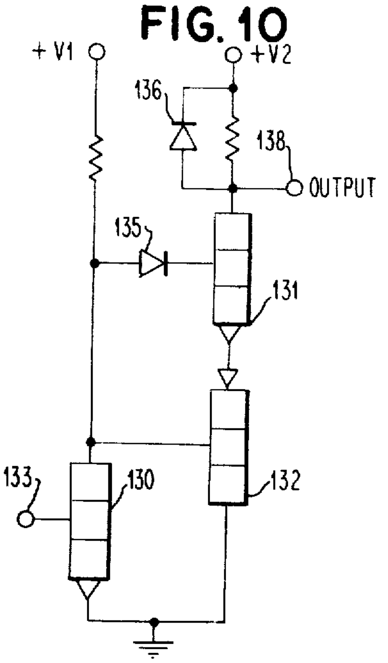
FIG. 10 is another single shot type circuit employing a storage mode element as the basic unit thereof.

FIG. 10 shows another single shot circuit advantageously employing the present invention and FIG. 11 provides a time base diagram therefor. In this circuit, voltage source V1 is greater than voltage source V2 and transistor 130 is normally conducting with transistors 131 and 132 being normally off. A trigger pulse 139 at the input terminal 133 is introduced to the base of transistor 130 which cuts off conduction of transistor 130. Diode 135 turns on and conducts into the base-collector of transistor 131 to V2 through diode 136, diode 136 being included to limit the voltage at the output to a diode drop higher than voltage V2. This action provides minority carrier injection into transistor 131 which is the storage mode transistor for this circuit.

When the input pulse 139 is removed allowing the current level to return to normal, transistor 130 again begins conducting. At this time, diode 135 blocks and transistor 131 is in storage providing emitter current to transistor 132 which has adequate base drive by means of transistor 130 to saturate. Thus, both transistors 131 and 132 are saturated and the output drops to a low voltage. When transistor 131 comes out of storage and has completely depleted the stored minority carriers, the collector voltage thereof will rise to the supply voltage V2. Accordingly, as can be seen from FIG. 11, the FIG. 10 circuitry will produce an output pulse at output terminal 138 which will commence with the termination of the input trigger 139 and continue for a width which is a function of the minority carrier storage and amplification of transistor 131 in conjunction with transistor 132. It should be noted that this circuit could provide one block of a chain of such circuits with the input and output tied to form a free-running oscillator ring.

Figure 14:
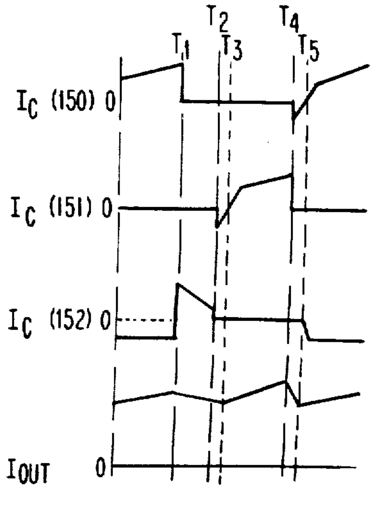
FIG. 14 is a somewhat idealized time base diagram of the operation of the power-OR circuit in FIG. 12.
Figure 12:
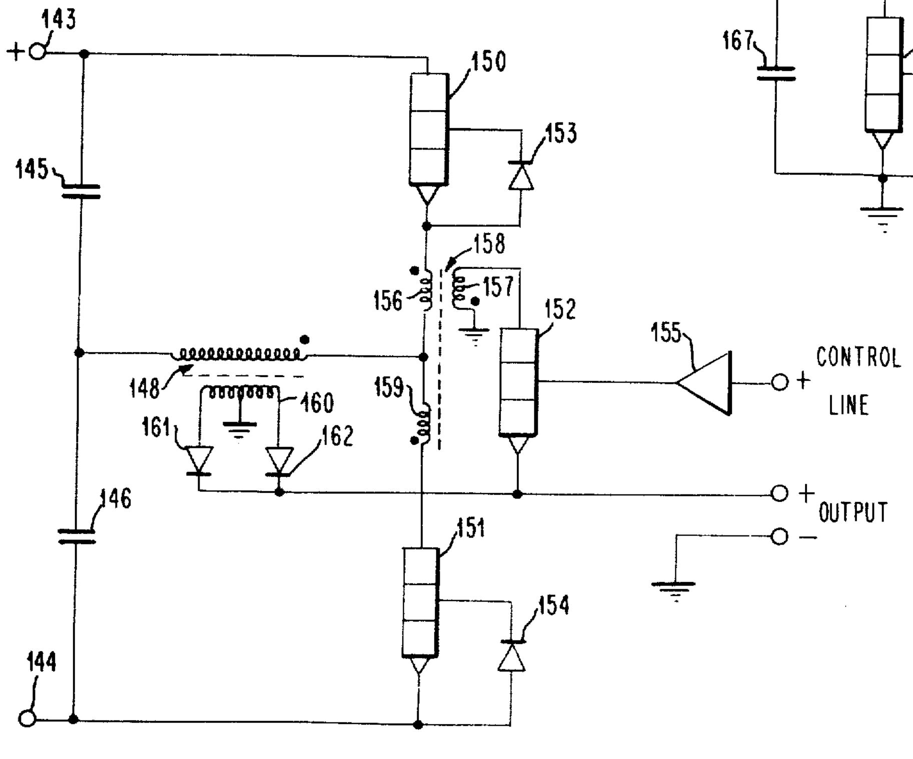
FIG. 12 is a storage power-OR circuit.

FIG. 12 illustrates a storage mode power-OR circuit in accordance with the present invention with a time base diagram thereof being presented in FIG. 14. This type of power supply is characterized by direct line to high frequency output power conversion which minimizes transformer size and by filling in the gaps of main line power by an inductor-transformer so as to reduce output capacitor requirements. Power-OR circuits require a driving circuit at main line potential which is controlled by the lead circuits. This means pulse transformer coupling to the main line inverter transistors and possible ground loop noise. The application of storage mode operation to this high frequency power system results in a simpler configuration, higher potential frequencies and control which may be effected entirely in the secondary circuit. Capacitors 145 and 146 are input storage capacitors coupled across the d.c. power source lines connected to terminals 143 and 144. Transformer 148 is a high frequency transformer and transistors 150 and 151 are high voltage storage mode transistors which handle relatively lower current. Transistor 152 is a low voltage storage mode transistor which handles relatively higher current.

For purposes of description, it is assumed that transistor 150 has acquired a stored minority carrier charge and has begun forward collector current conduction in the interval preceding T1 in FIG. 14. The Ic from transistor 150 will thus enter the dot end of winding 156. Secondary winding 157 will develop a resultant voltage that will back-bias the collector of transistor 152. Assuming that an appropriate control signal is introduced to amplifier 155, output current from 155 will enter the base of transistor 152 to effect minority carrier storage in the collector thereof, this being shown as the negative Ic current for 152 in FIG. 14. Amplifier 155 can be used to control the magnitude of the minority carrier injection current into 152 thereby permitting regulator type control.

The collector current from 150 after flowing through 156 enters the primary of transformer 148 thereby delivering output power via secondary 160 and either diode 161 or 162. When the minority carriers are depleted in transistor 150, it will shut off at T1 which causes the collector potential across transistor 152 to reverse. Transistor 152 then begins forward conduction as a result of the stored minority carriers. When transistor 152 depletes its stored charge at T2, the energy in inductor 158 is delivered through winding 159 so that minority carrier charging current flows through the collector-base circuit of transistor 151, diode 154 and the primary of 148 thus charging capacitor 146. This current continues until T3 when the energy in inductor 158 drops to zero and the current through transistor 151 reverses as a result of the then normally forward potential being applied at the collector of 151 by capacitor 146. Capacitor 146 will discharge between T3 and T4 through the primary of transformer 148, inductor winding 159 and transistor 151 thereby depleting the stored charge in 151 which occurs at T4.

After T4, the energy in inductor 159 is supplied to winding 156 which effects minority carrier storage in transistor 150 via diode 153 and causes a charge to be placed on capacitor 145. As the energy in inductor 158 reaches zero at T5, the potential at the collector of 150 will reverse so that normal forward collector current flows therethrough and minority carrier injection for transistor 152 will again commence. Thus one cycle of operation of the FIG. 12 circuit is completed. It should be noted from the output current plot in FIG. 14 that the conduction of transistor 152 between times T1 and T2 permits direct control of the average current output by means of the control amplifier 155. This makes the FIG. 12 circuit well suited for purposes of well regulated high frequency power conversion.

Figure 13:
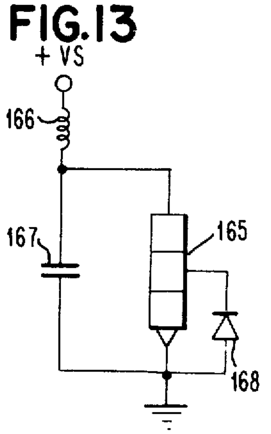
FIG. 13 is a simple oscillator circuit utilizing the storage mode unit as the basic element thereof.

FIG. 13 shows a transistor oscillator employing the basic minority carrier injection configuration for a control element thereof. A means not shown would be included for actuating the circuit and could be accomplished simply by introducing a pulse to the base of transistor 165. Once started, the circuit operates as an impulse oscillator; the impulse occurs when the storage mode transistor 165 depletes its storage charge. When transistor 165 is in storage, the current in inductor 166 builds up at a rate of approximately VS/L amps/sec. When transistor 165 depletes, the current in inductor 166 rings with capacitor 167, this eventually causing the capacitor voltage to reverse which causes the collector of transistor 165 to acquire a minority carrier injection through diode 168 thereby initiating another cycle. This particular circuit may be useful for power supplies for high voltage when the inductor 166 may be the inherent inductance of a high voltage type transformer such as is utilized in flyback circuits.

While the present invention has been particularly shown and described with reference to the preferred embodiments thereof, many changes, additions and modifications in form and detail will be understood by those having normal skill in the art without departing from the spirit and scope of this invention.

What is claimed is:

1. A switching type circuit comprising a semiconductor device having at least base, collector and emitter regions, the thickness of said base region being small compared to the minority carrier diffusion length therein, said collector region having substantial minority carrier storage capability, means for injecting minority carriers from said base into said collector region to achieve substantial charge storage in the latter, and means for applying a potential across said collector and emitter regions for effecting current flow between said collector and emitter regions as a result of the presence of said charge from said minority carriers, said last recited means having circuit parameters such that carrier depletion is the dominant factor in termination of said current, whereby the collector-emitter current flow will be proportioned to the minority carrier injection charge, which includes trigger means for initiating operation of said minority carrier injection means, and means for causing said potential applying means to be effective subsequent to actuating of said triggering means for providing forward collector-emitter current flow.

2. Apparatus in accordance with claim 1 which includes a first diode and a resistive means, said potential applying means being a power source resistively connected across the collector and emitter of said device, said first diode and said resistive means being connected in series circuit relation across said power source with said first diode being connected to the emitter of said device, said minority carrier injecting means being a second diode coupled on one side to the base of said device and on the other side to the junction of said first diode and said resistive means, said triggering means being a circuit coupled to the collector of said device for selectably reversing the potential at the collector of said device, said second diode being arranged for permitting minority carrier injection current to flow into the collector of said device whenever said triggering means is actuated, forward collector-emitter current flowing through said device after removal of the trigger.

3. Apparatus in accordance with claim 2 wherein said triggering means includes a third diode and an input terminal with said diode coupling said terminal to said collector, said triggering means further including a biasing voltage source for maintaining the potential at said terminal at least equal to the potential of said power source, the triggering being effected by reducing said biasing voltage to a magnitude less than said power source with said third diode preventing current flow at said terminal whenever said trigger is absent.

4. Apparatus in accordance with claim 1 wherein said potential applying means includes a first power source resistively connected to said semiconductor device, said minority carrier injecting means includes a diode connected on one side to the base of said semiconductor device and a second power source resistively connected to the other side of said diode, said second power source providing a potential greater than said first power source for effecting minority carrier injection into the said collector of said semiconductor device through said diode, and said triggering means including a second semiconductor device having at least a collector, emitter and base, the collector-emitter circuit thereof being coupled between the said other side of said diode and said second power source for normally preventing said minority carrier injection through said diode, means for introducing trigger pulses to the base of said second semiconductor device for causing said second device to permit said minority carrier injection, forward collector-emitter current flowing through said first device after removal of said trigger.

5. Apparatus in accordance with claim 1, wherein said means for causing said potential applying means to be effective subsequent to actuating of said triggering means for providing forward collector-emitter current flow comprises a third semiconductor device having at least a collector, emitter and base, the collector-emitter circuit thereof being coupled between said first mentioned semiconductor device and said first power source, the base of said third semiconductor device being connected to said other side of said diode.

* * * * *